(12) United States Patent
Ohashi et al.

(10) Patent No.: US 11,276,554 B2
(45) Date of Patent: Mar. 15, 2022

(54) SCANNING ELECTRON MICROSCOPE AND METHOD FOR MEASURING PATTERN

(71) Applicant: Hitachi High-Tech Corporation, Tokyo (JP)

(72) Inventors: Takeyoshi Ohashi, Tokyo (JP); Yusuke Abe, Tokyo (JP); Kenji Tanimoto, Tokyo (JP); Kaori Bizen, Tokyo (JP); Hyejin Kim, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/941,806

(22) Filed: Jul. 29, 2020

(65) Prior Publication Data

US 2021/0043420 A1 Feb. 11, 2021

(30) Foreign Application Priority Data

Aug. 7, 2019 (JP) .............................. JP2019-145363

(51) Int. Cl.
*H01J 37/28* (2006.01)
*H01J 37/244* (2006.01)
*H01J 37/12* (2006.01)

(52) U.S. Cl.
CPC .............. *H01J 37/28* (2013.01); *H01J 37/12* (2013.01); *H01J 37/244* (2013.01);
(Continued)

(58) Field of Classification Search
CPC .. H01J 37/00; H01J 37/02; H01J 37/22; H01J 37/222; H01J 37/24; H01J 37/26;
(Continued)

(56) References Cited

U.S. PATENT DOCUMENTS

| 4,767,926 A | 8/1988 | Murakoshi et al. |
| 5,212,028 A | 5/1993 | Fujino |

(Continued)

FOREIGN PATENT DOCUMENTS

| JP | S631910 A | 1/1988 |
| JP | H04149944 A | 5/1992 |

(Continued)

OTHER PUBLICATIONS

Search Report dated Jun. 25, 2020 in International Application No. PCT/JP2019/015151.
(Continued)

*Primary Examiner* — Jason L McCormack
(74) *Attorney, Agent, or Firm* — Miles & Stockbridge, P.C.

(57) ABSTRACT

A scanning electron microscope includes an electron-optical system including an electron source and an objective lens, a stage on which a sample is placed, a secondary electron detector disposed adjacent to the electron source relative to the objective lens and configured to detect secondary electrons, a backscattered electron detector disposed between the objective lens and the stage and configured to detect backscattered electrons, a backscattered electron detection system controller configured to apply a voltage to the backscattered electron detector, and a device-control computer configured to detect a state of an electrical charge carried by the backscattered electron detector based on signal intensity at the secondary electron detector when the primary electrons are applied to the sample with a predetermined voltage applied to the backscattered electron detector.

12 Claims, 11 Drawing Sheets

(52) U.S. Cl.
CPC ............. *H01J 2237/2448* (2013.01); *H01J 2237/24475* (2013.01); *H01J 2237/24564* (2013.01)

(58) Field of Classification Search
CPC .......... H01J 37/261; H01J 37/10; H01J 37/28; H01J 37/244; H01J 37/248; H01J 37/12
USPC .................................. 250/306, 307, 310, 311
See application file for complete search history.

(56) References Cited

U.S. PATENT DOCUMENTS

| | | | |
|---|---|---|---|
| 5,412,210 A | 5/1995 | Todokoro et al. | |
| 5,434,409 A | 7/1995 | Tsubusaki | |
| 5,493,403 A | 2/1996 | Nishi | |
| 5,552,602 A | 9/1996 | Kakibayashi et al. | |
| 5,831,273 A | 11/1998 | Someda et al. | |
| 5,912,467 A | 6/1999 | Okino | |
| 5,912,469 A | 6/1999 | Okino | |
| 6,399,945 B1 | 6/2002 | Hirayanagi | |
| 6,734,429 B2 | 5/2004 | Takagi | |
| 6,946,656 B2 | 9/2005 | Ezumi et al. | |
| 7,483,560 B2 | 1/2009 | Shishido et al. | |
| 8,481,934 B2 | 7/2013 | Ezumi et al. | |
| 8,788,242 B2 | 7/2014 | Matsuoka et al. | |
| 9,472,376 B2 | 10/2016 | Yokosuka et al. | |
| 2005/0173633 A1 | 8/2005 | Tanaka et al. | |
| 2006/0002604 A1 | 1/2006 | Sakai et al. | |
| 2006/0202119 A1 | 9/2006 | Yamada et al. | |
| 2008/0203298 A1 | 8/2008 | Ishijima et al. | |
| 2009/0212215 A1 | 8/2009 | Nagatomo et al. | |
| 2009/0214103 A1 | 8/2009 | Tanaka et al. | |
| 2012/0037801 A1 | 2/2012 | Mochizuki et al. | |
| 2012/0126116 A1 | 5/2012 | Tanaka et al. | |
| 2012/0305767 A1 | 12/2012 | Toyoda et al. | |
| 2013/0216141 A1 | 8/2013 | Ushiba et al. | |
| 2014/0021348 A1* | 1/2014 | Hoque ................... | H01J 37/29 250/310 |
| 2014/0070099 A1 | 3/2014 | Aliman et al. | |
| 2014/0175279 A1 | 6/2014 | Agemura | |
| 2014/0217274 A1 | 8/2014 | Wang et al. | |
| 2016/0035538 A1 | 2/2016 | Fukuda | |
| 2016/0117847 A1 | 4/2016 | Pandev et al. | |
| 2016/0307730 A1 | 10/2016 | Namai et al. | |
| 2016/0379798 A1 | 12/2016 | Shishido et al. | |
| 2018/0033588 A1* | 2/2018 | Kumamoto ............. | H01J 37/21 |
| 2018/0182595 A1 | 6/2018 | Yokosuka et al. | |
| 2019/0362933 A1 | 11/2019 | Takagi et al. | |
| 2021/0012998 A1 | 1/2021 | Nishihata et al. | |
| 2021/0027455 A1 | 1/2021 | Kimizuka et al. | |

FOREIGN PATENT DOCUMENTS

| | | |
|---|---|---|
| JP | 2003157790 A | 5/2003 |
| JP | 2006119133 A | 5/2006 |
| JP | 2008218014 A | 9/2008 |
| JP | 2010175249 A | 8/2010 |
| JP | 201330277 A | 2/2013 |
| JP | 201333671 A | 2/2013 |
| JP | 201345500 A | 3/2013 |
| JP | 5313939 B2 | 10/2013 |
| JP | 2014130077 A | 7/2014 |
| JP | 5619118 B2 | 11/2014 |
| JP | 2015106530 A | 6/2015 |
| JP | 2017103363 A | 6/2017 |

OTHER PUBLICATIONS

Written Opinion dated Jun. 25, 2020 in International Application No. PCT/JP2019/015151.
Search Report dated Jun. 25, 2020 in International Application No. PCT/JP2019/015148.
Written Opinion dated Jun. 25, 2020 in International Application No. PCT/JP2019/015148.
International Preliminary Examination Report dated Jun. 25, 2020 in International Application No. PCT/JP2019/015148.

* cited by examiner

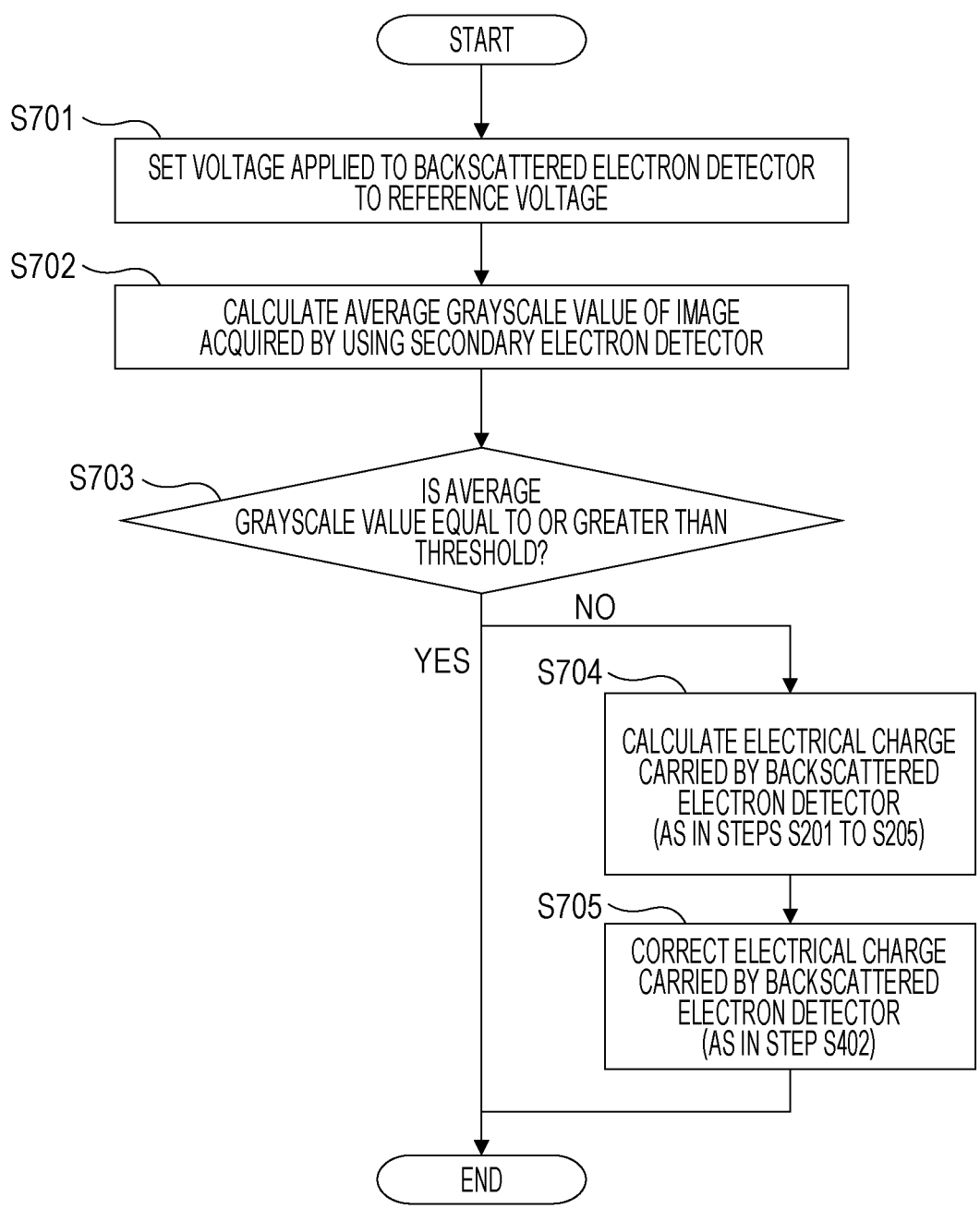

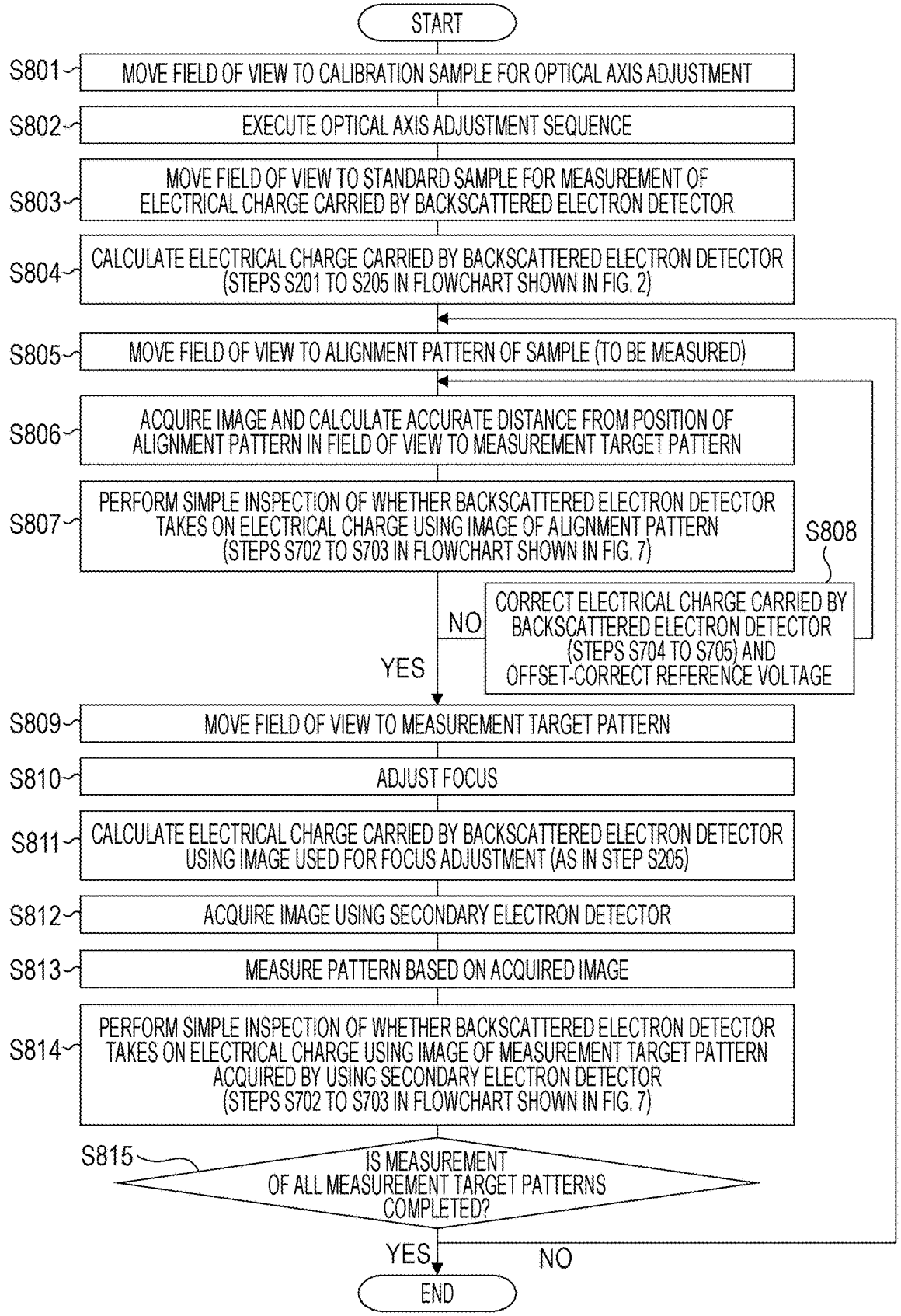

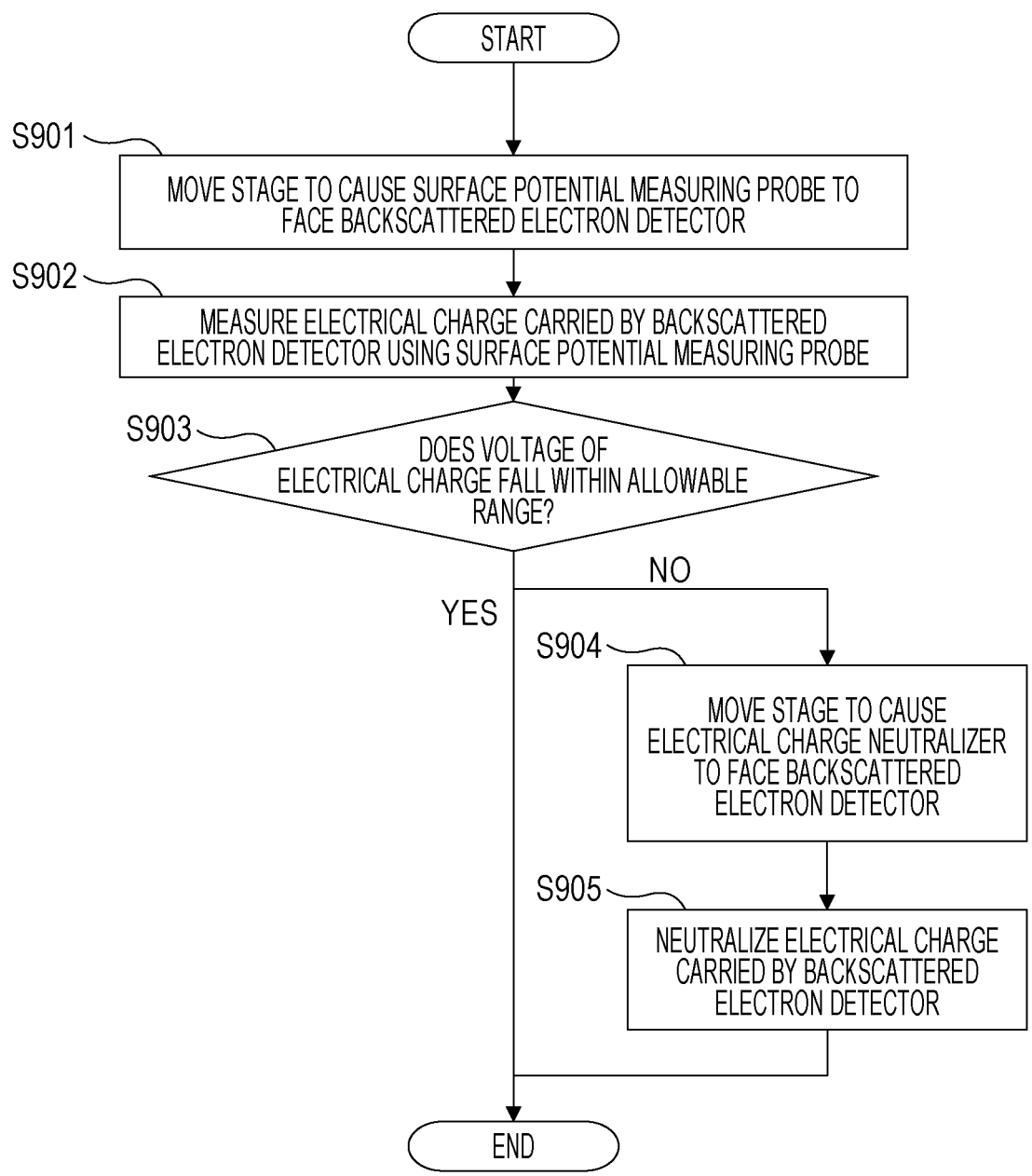

SCANNING ELECTRON MICROSCOPE AND METHOD FOR MEASURING PATTERN

CROSS-REFERENCE TO RELATED APPLICATION

This application claims priority to Japanese Patent Application No. 2019-145363 filed on Aug. 7, 2019, the entire contents of which are incorporated by reference herein.

BACKGROUND OF THE INVENTION

1. Field of the Invention

The present invention relates to a scanning electron microscope that performs an inspection and measurement using an electron beam and a method for measuring a pattern using the scanning electron microscope.

2. Description of the Related Art

A scanning electron microscope (SEM) accelerates electrons emitted from an electron source and focuses and applies the electrons to a surface of a sample using an electrostatic lens or electromagnetic lens. The electrons applied to the sample are referred to as primary electrons. Signal electrons (herein, low-energy signal electrons are referred to as secondary electrons, and high-energy signal electrons are referred to as backscattered electrons) are emitted from the sample in response to the primary electrons impinging on the sample. Detecting the secondary electrons emitted from the sample while deflecting and scanning the electron beam allows an image of a fine pattern on the sample to be obtained. As for a method for detecting the backscattered electrons and the secondary electrons, JP 2013-33671 A discloses a method for mainly detecting the secondary electrons using a detector disposed adjacent to an electron source relative to an electromagnetic lens located closest to a sample (hereinafter, referred to as an objective lens) and mainly detecting the backscattered electrons using a detector disposed between the sample and the objective lens.

In a case where an insulator sample is observed with the SEM, the surface of the sample may take on an electrical charge due to the application of the primary electrons. The charged surface of the sample may cause the energy or path of the primary electrons or secondary electrons to change and in turn may cause a signal to be detected to change. JP2008-218014 A discloses a technique for measuring the surface potential of the charged sample, using an energy filter disposed on the path along which the secondary electrons impinge on a detector, from a signal amount acquired while changing a voltage applied to the energy filter.

SUMMARY OF THE INVENTION

As disclosed in JP 2013-33671 A, the configuration where the backscattered electrons are detected by the backscattered electron detector disposed between the sample and the objective lens, and the secondary electrons that have passed through the objective lens are detected by the secondary electron detector disposed adjacent to the electron source relative to the objective lens may cause the path of the second electrons to change due to an electrical charge carried by the surface of the backscattered electron detector and in turn cause the signal amount to be detected by the secondary electron detector to change.

This problem will be described with reference to FIG. 1. FIG. 1 schematically shows a structure around the backscattered electron detector of the SEM. In this example, as a backscattered electron detector 125, an annular scintillator is provided. The backscattered electron detector 125 is disposed in the vicinity of the sample so as to detect as many as possible of backscattered electrons 172 emitted from a sample 114 in response to primary electrons 170 impinging on the sample 114. This causes a large amount of backscattered electrons to impinge on the scintillator to cause the scintillator to take on an electrical charge. Even when the surface of the scintillator is treated to be a conductor in order to prevent the backscattered electron detector 125 from taking on an electrical charge, organic contaminants may be built up on the surface of the conductor to cause the backscattered electron detector 125 to take on an electrical charge. A cause of such organic contaminants is that an organic gas present in a sample chamber is immobilized by the application of the electron beam. An organic gas generated by degassing from the sample 114 is often present at a high concentration around the backscattered electron detector 125 installed in the vicinity of the sample 114, so that, when a large amount of the backscattered electrons 172 impinge on the backscattered electron detector 125, the organic gas is immobilized on the surface of the detector, and a risk of causing the backscattered electron detector 125 to take on an electrical charge increases.

The electrical charge carried by the backscattered electron detector 125 affects the path of the secondary electrons 171 that are detected by the secondary electron detector 120 after passing through a hole of the backscattered electron detector 125 and an aperture of an objective lens 109. In particular, when the backscattered electron detector 125 takes on a negative electrical charge, a potential barrier is formed around the hole of the backscattered electron detector 125, and secondary electrons 171b that are low in energy cannot pass through the potential barrier and are attracted back to the sample, thereby preventing the secondary electrons 171b from being detected by the secondary electron detector 120. That is, the amount of signal detected by the secondary electron detector 120 decreases due to the electrical charge carried by the backscattered electron detector 125. When the SEM is used for inspection or measurement, result reproducibility is important, so that it is not desirable that the signal amount of the secondary electrons to be detected be changed due to that the backscattered electron detector 125 takes on an electrical charge with time.

A scanning electron microscope according to an aspect of the present invention includes an electron-optical system including an electron source configured to emit primary electrons and an objective lens, a stage on which a sample is placed, a secondary electron detector disposed adjacent to the electron source relative to the objective lens and configured to detect secondary electrons emitted by interactions between the primary electrons and the sample, a backscattered electron detector disposed between the objective lens and the stage and configured to detect backscattered electrons emitted by interactions between the primary electrons and the sample, a backscattered electron detection system controller provided for the backscattered electron detector and configured to apply a voltage to the backscattered electron detector, and a device-control computer configured to detect a state of an electrical charge carried by the backscattered electron detector based on signal intensity at the secondary electron detector when the primary electrons are applied to the sample with a predetermined voltage applied to the backscattered electron detector.

A method for measuring a pattern according to another aspect of the present invention is a method for measuring a pattern of a sample using a scanning electron microscope including an electron-optical system including an electron source configured to emit primary electrons and an objective lens, a stage on which the sample is placed, a secondary electron detector disposed adjacent to the electron source relative to the objective lens and configured to detect secondary electrons emitted by interactions between the primary electrons and the sample, and a backscattered electron detector disposed between the objective lens and the stage and configured to detect backscattered electrons emitted by interactions between the primary electrons and the sample, the method including a first step of adjusting an optical condition applied to the electron-optical system, a second step of acquiring an image containing an alignment pattern of the sample using the secondary electron detector and calculating an accurate distance from the alignment pattern to a measurement target pattern; a third step of adjusting a focus by moving a field of view to the measurement target pattern, a fourth step of acquiring an image containing the measurement target pattern using the secondary electron detector and measuring the measurement target pattern, and a fifth step of acquiring, in at least one of the second step and the fourth step, the image with a reference voltage applied to the backscattered electron detector and determining whether the backscattered electron detector takes on an electrical charge based on signal intensity at the secondary electron detector calculated from the image, in which the reference voltage is a voltage that is applied to the backscattered electron detector when the adjustment to the optical condition applied to the electron-optical system is completed in the first step.

It is possible to reduce or avoid fluctuations of the detection signal amount of the secondary electrons due to the electrical charge carried by the backscattered electron detector, thereby allowing highly reliable inspection and measurement.

Problems, configurations, and effects other than those described above will be apparent from the description of the embodiments given below.

BRIEF DESCRIPTION OF THE DRAWINGS

FIG. 7A is a flowchart of a fourth embodiment;

FIG. 8 is a flowchart of a fifth embodiment;

FIG. 9 is a flowchart of a sixth embodiment;

DESCRIPTION OF THE PREFERRED EMBODIMENTS

A description will be given of embodiments of the present invention with a scanning electron microscope (SEM) taken as an example. Note that the present invention is applicable to electron beam devices other than the SEM. Further, an example will be described where, as signal intensity at a secondary electron detector, an average grayscale value of an image acquired by using the secondary electron detector is used, but the present invention is not limited to such an example, and, for example, an electrical signal output from the secondary electron detector may be used.

Figure 12:
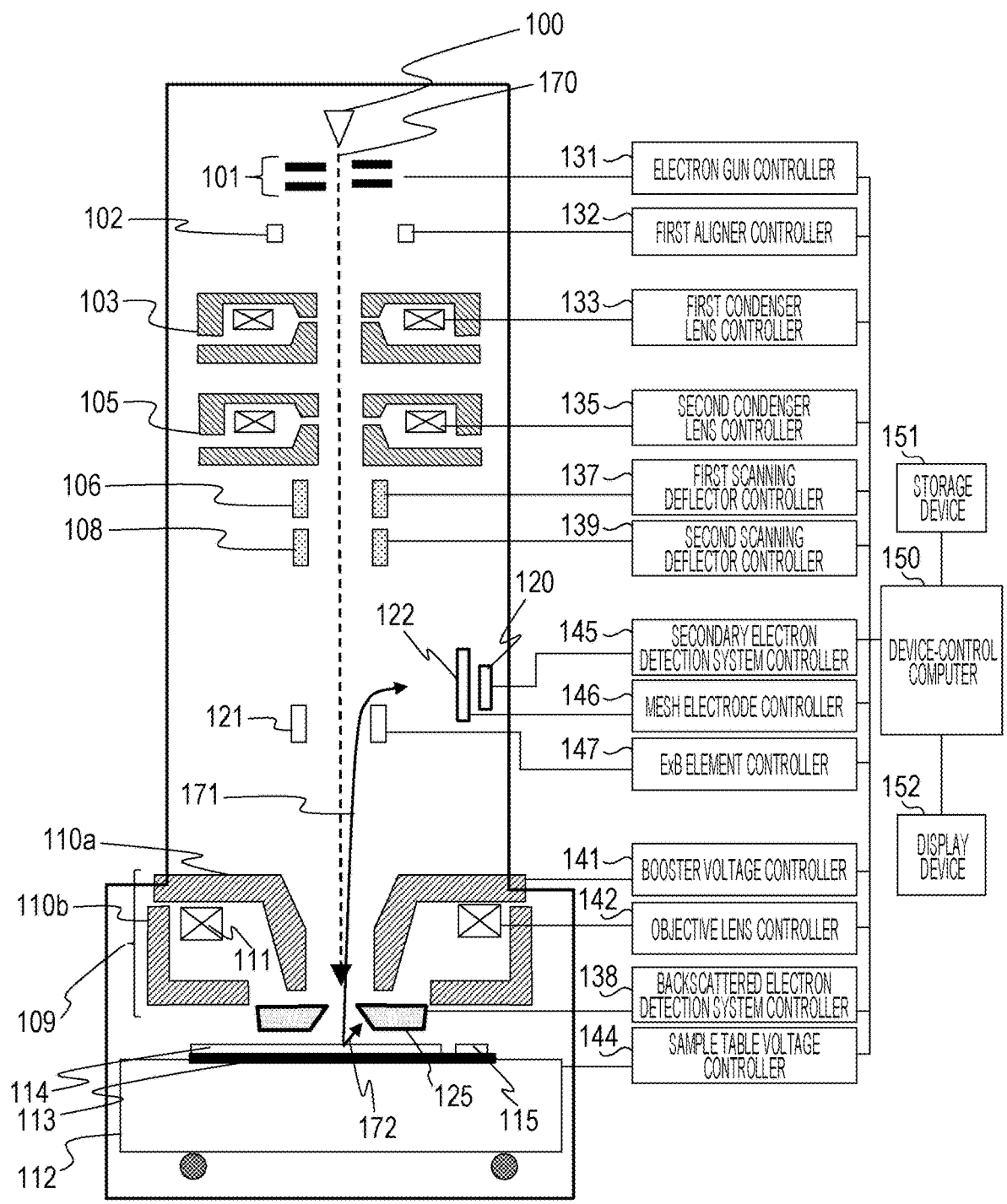
FIG. 12 is an overall schematic view of a SEM.

FIG. 12 is an overall schematic diagram of the SEM. An electron beam (primary electrons 170) emitted from an electron source 100 is accelerated by an electron gun 101, passes through a first condenser lens 103 and a second condenser lens 105, and is applied, through an objective lens 109, to a sample 114 held by a sample table 113 on a stage 112 to form an image on the sample 114. A configuration is employed where a positive voltage is applicable to an upper magnetic path 110a of the objective lens from a booster voltage controller 141, and a negative voltage is applicable to the sample 114 from a sample table voltage controller 144 to form an electrostatic lens, so-called deceleration optical system. Further, an aperture determined by the upper magnetic path 110a and lower magnetic path 110b of the objective lens 109 is oriented toward the stage 112, which forms a lens structure called a semi-in lens type. This allows an electron beam with high resolution to be formed. An objective lens controller 142 controls an exciting current flowing through an objective lens coil 111.

Secondary electrons 171 that are low in energy and emitted from the sample 114 are caught up by a magnetic field generated by the objective lens and detected by a secondary electron detector 120 located upstream of the objective lens. The secondary electrons 171 are deflected by an ExB element 121 on the upstream side of the objective lens and then reaches the secondary electron detector 120 after passing through a mesh electrode 122. The ExB element 121 is an electron-optical element capable of generating an electric field and a magnetic field that are orthogonal to each other and is controlled by an ExB element controller 147. The secondary electron detector 120 attracts the secondary electrons 171 with a positive voltage, and thus the mesh electrode 122 plays a role of blocking a leaked electric field. The potential of the mesh electrode 122 is controlled by a mesh electrode controller 146. A secondary electron detection system controller 145 amplifies a signal detected by the secondary electron detector 120 and sends the signal to a device-control computer 150.

On the other hand, backscattered electrons 172 that are high in energy are detected by a backscattered electron detector 125 located between the magnetic paths 110a, 110b of the objective lens and the sample table 113. The backscattered electron detector 125 has a hole flared toward the sample table 113 and detects the backscattered electrons 172 on a flared surface (inner wall of the hole) and lower surface. A backscattered electron detection system controller 138 controls a voltage applied to the backscattered electron detector 125, amplifies a signal detected by the detector, and sends the signal to the device-control computer 150.

The primary electrons 170 are two-dimensionally scanned over the sample by a first scanning deflector 106 and a second scanning deflector 108, thereby allowing a two-dimensional image of the sample to be obtained. In general, the two-dimensional scanning is executed by horizontal line scanning that is repeatedly performed while a start position of each horizontal line scanning is moved in a vertical direction. A center position of this two-dimensional image is determined by the first scanning deflector 106 controlled by a first scanning deflector controller 137 and the second scanning deflector 108 controlled by a second scanning deflector controller 139. Both the first scanning deflector 106 and the second scanning deflector 108 are electrostatic deflectors. The two-dimensional image is formed by the device-control computer 150 and displayed on a display device 152. Note that the electron gun 101 is controlled by an electron gun controller 131, the first condenser lens 103 is controlled by a first condenser lens controller 133, and the second condenser lens 105 is controlled by a second condenser lens controller 135. A first aligner 102 that controls a beam axis of the primary electrons 170 is disposed in a stage following the electron gun 101 and is controlled by a first aligner controller 132.

Further, the device-control computer 150 responsible for controlling the entire device controls, in a centralized manner, the controllers of the electron-optical system and detection system based on control data and the like stored in a storage device 151. Detection signals detected by the two detectors 120, 125 are used by the device-control computer 150 to form an image, and then stored in the storage device 151 or displayed on the display device 152.

First Embodiment

In the SEM having the configuration shown in FIG. 12, a voltage is applied to the backscattered electron detector 125, a signal amount of the secondary electrons detected by the secondary electron detector 120 is measured while changing the applied voltage, and the result shows that the signal amount (signal intensity) of the secondary electrons changes sharply when the voltage applied to the backscattered electron detector 125 changes from negative to positive. With an electrical charge carried by the backscattered electron detector 125, the sharp change in the signal amount of the secondary electrons occurs under a condition where the voltage of the electrical charge and the applied voltage cancel each other. According to the first embodiment, this phenomenon is used for measurement of the electrical charge carried by the backscattered electron detector 125.

Figure 1:
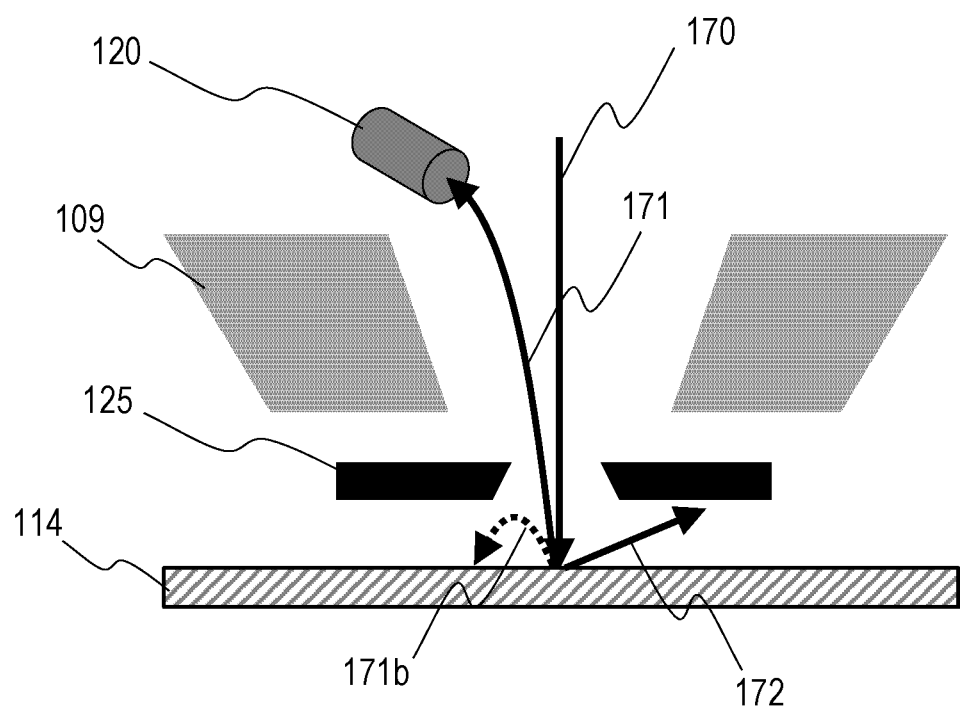
FIG. 1 is a diagram for describing a problem in the present invention.
Figure 2:
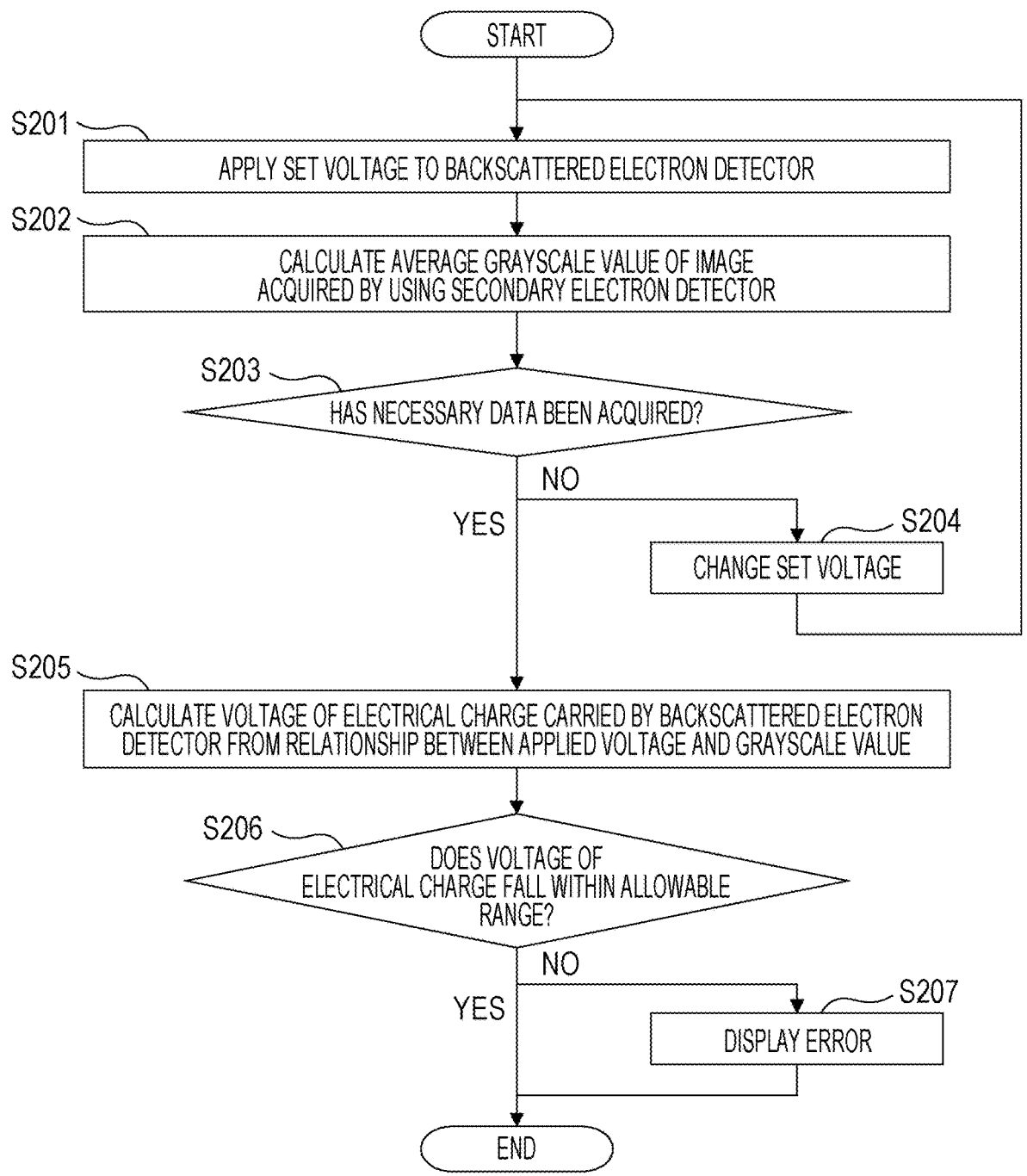
FIG. 2 is a flowchart of a first embodiment.

FIG. 2 is a flowchart of measuring the electrical charge carried by the backscattered electron detector, and displaying an error and giving a warning to an operator of the SEM when the electrical charge exceeds a preset allowable amount. This flowchart is executed by the device-control computer 150.

In step S201, a preset voltage is applied to the backscattered electron detector 125.

In step S202, the image of the sample is acquired by using the secondary electron detector 120, and the average grayscale value of the image is calculated. Herein, the sample of which the image is acquired is a sample that takes on no electrical charge or takes on a sufficiently small electrical charge. This prevents the electrical charge carried by the sample itself from affecting the signal amount of the secondary electrons detected by the secondary electron detector 120. For example, it is desirable to use a semiconductor or conductor sample such as silicon (Si) or a metal film.

Further, it is desirable that no pattern be present in a field of view for acquiring the detection image. This is because the field of view moves in response to a change in the voltage applied to the backscattered electron detector 125, and when a pattern is present in the field of view, the average grayscale value may change due to the movement of the field of view. A pattern may be present if the change in image grayscale value due to the movement of the field of view or the like is sufficiently small. Although it is most preferable that a sample and field of view dedicated to this measurement be used, in order to increase the throughput, this flow may be executed with a field of view for pattern measurement. In such a case, it is desirable that the electron-optical system be adjusted in advance such that the movement of the field of view in response to the change in the voltage applied to the backscattered electron detector 125 is sufficiently small.

In step S203, a determination is made as to whether data necessary for determining a change point of the signal amount of the secondary electrons has been acquired. Until the necessary data is acquired, changing the set voltage applied to the backscattered electron detector 125 by a preset amount (step S204), step S201, and step S202 are repeated. The determination in step S203 may be made based on whether a predetermined number of times has been reached, a change in the grayscale value has occurred, or the grayscale value has changed to exceed a predetermined threshold.

Note that the procedure of repeating the voltage setting, the image acquisition, and the grayscale value calculation in the order of steps S201 to S204 has been described, but these steps may be executed in parallel, or the grayscale value calculation may be executed in a collective manner at the end.

Figure 3:
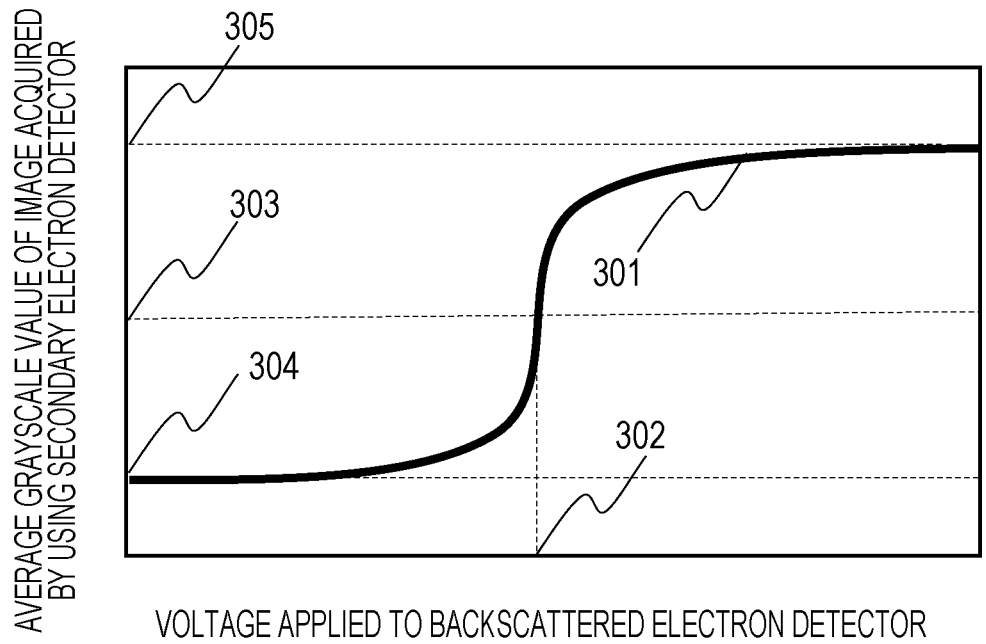
FIG. 3 is a diagram showing a relationship between a voltage applied to a backscattered electron detector and an average grayscale value of an image formed by secondary electrons.

In step S205, the voltage of the electrical charge carried by the backscattered electron detector is calculated from a relationship between the voltage applied to the backscattered electron detector 125 and the average grayscale value of the image acquired in the above steps. FIG. 3 shows a relationship 301 between the voltage applied to the backscattered electron detector 125 and the average grayscale value of the image formed by the secondary electrons. An applied voltage 302 that cancels the electrical charge carried by the backscattered electron detector 125 is determined from a sharp change point of a waveform 301. The change point may be determined as a point at which a differential of the waveform 301 is largest or as a point that is equal to a threshold grayscale value 303. The threshold grayscale value 303 may be a predetermined value, or may be the average of a minimum grayscale value 304 and a maximum grayscale value 305 in the obtained waveform 301. Note that when a predetermined value is used as the threshold grayscale value 303, it is required that, in view of the fact that a measured grayscale value depends on the current amount (probe current) of the primary electrons, correction such as standardization based on the probe current be made. The voltage of the electrical charge carried by the backscattered electron detector 125 can be calculated through positive/negative inversion of the voltage 302 at the change point thus determined.

In step S206, a determination is made as to whether the voltage of the electrical charge thus calculated falls within a predetermined allowable range. When the voltage falls out of the allowable range, the processing proceeds to step S207 to display an error on the display device 152, and when the voltage falls within the allowable range, the processing is brought to an end.

The above-described method allows the electrical charge carried by the backscattered electron detector 125 to be detected. This in turn makes it possible to exclude a result of pattern measurement significantly affected by the electrical charge from the whole result, or to encourage maintenance of the SEM to prevent the electrical charge from further exerting influence or further increasing.

Second Embodiment

Figure 4:
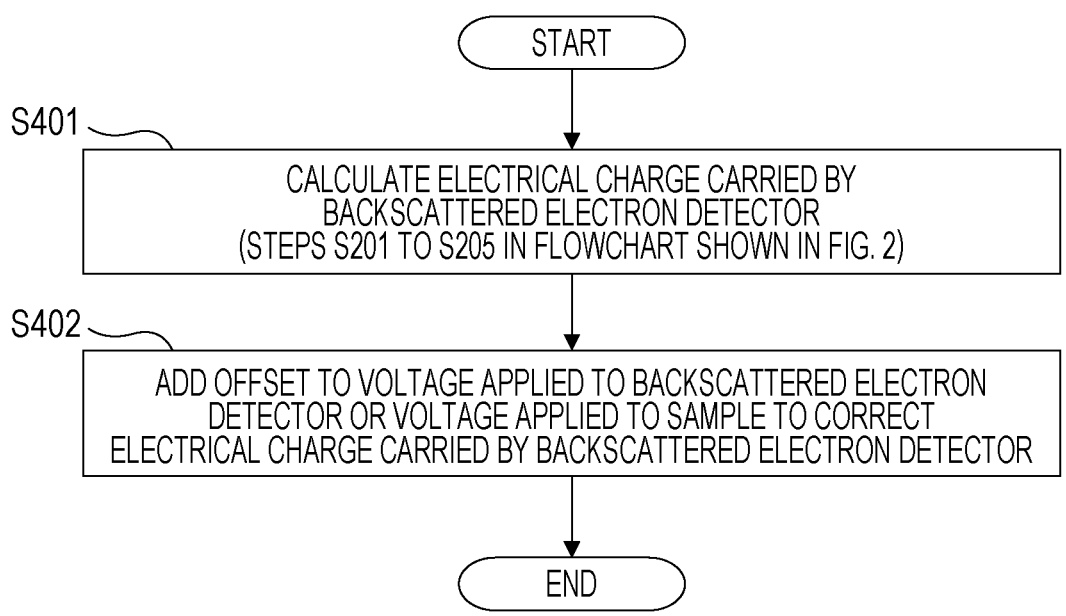
FIG. 4 is a flowchart of a second embodiment.

FIG. 4 is a flowchart of measuring the electrical charge carried by the backscattered electron detector 125 and correcting the effect of the charge.

In step S401, the voltage of the electrical charge carried by the backscattered electron detector 125 is calculated in the same manner as in steps S201 to S205 according to the first embodiment. This flowchart is also executed by the device-control computer 150.

In step S402, the electrical charge measured in step S401 is corrected. Specifically, a voltage that cancels the voltage of the electrical charge or a voltage higher than the voltage of the electrical charge is constantly applied to the backscattered electron detector 125 as an offset voltage. Note that the offset voltage may be greater than the voltage that cancels the voltage of the electrical charge, but needs to be set to a level at which an influence on the path of the primary electrons 170 is negligible.

As another method, a voltage equal to or lower than the voltage of the electrical charge is constantly applied as the offset voltage to the sample table 113 by the sample table voltage controller 144. However, when the offset voltage is applied to the sample table 113, that is, the sample 114, the landing energy of the primary electrons 170 changes, and the energy and path of the secondary electrons 171 also change, which makes it necessary to adjust the electron-optical system to correct these changes. Therefore, the method for applying the offset voltage to the backscattered electron detector 125 is more desirable.

The above-described method makes it possible to suppress, even when the backscattered electron detector 125 takes on an electrical charge, the influence on the detection of secondary electrons, thereby allowing highly reliable pattern measurement.

Third Embodiment

Figure 5:
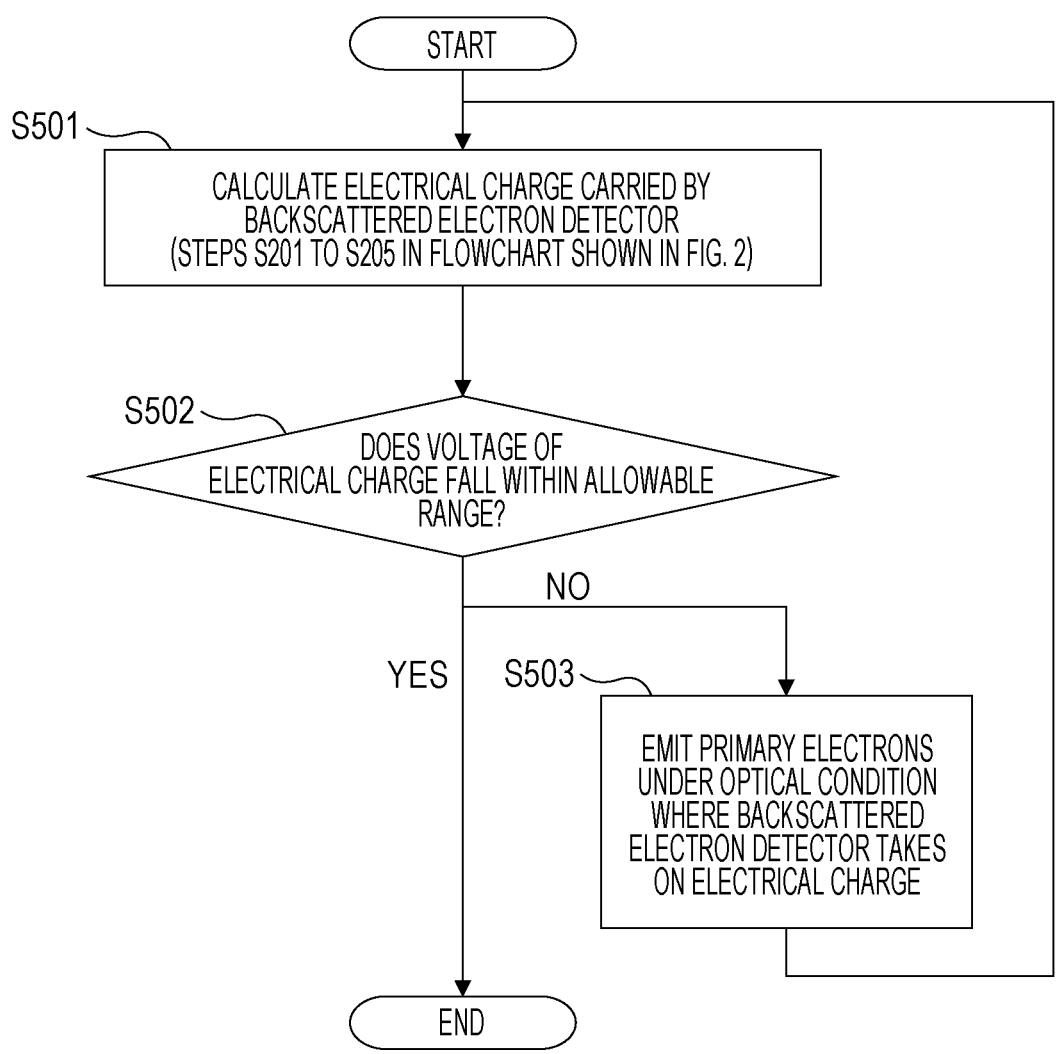
FIG. 5 is a flowchart of a third embodiment.

FIG. 5 is a flowchart of measuring the measured electrical charge carried by the backscattered electron detector 125 and neutralizing or reducing the charge. This flowchart is also executed by the device-control computer 150.

In step S501, the voltage of the electrical charge carried by the backscattered electron detector 125 is calculated in the same manner as in steps S201 to S205 according to the first embodiment.

In step S502, a determination is made as to whether the measured voltage of the electrical charge falls within the allowable range, and when the voltage falls out of the allowable range, the processing proceeds to step S503.

In step S503, the optical condition is adjusted such that the backscattered electron detector 125 takes on a positive electrical charge, and then the primary electrons 170 are emitted toward the sample 114 to neutralize or reduce a negative electrical charge carried by the backscattered electron detector 125.

Figure 6:
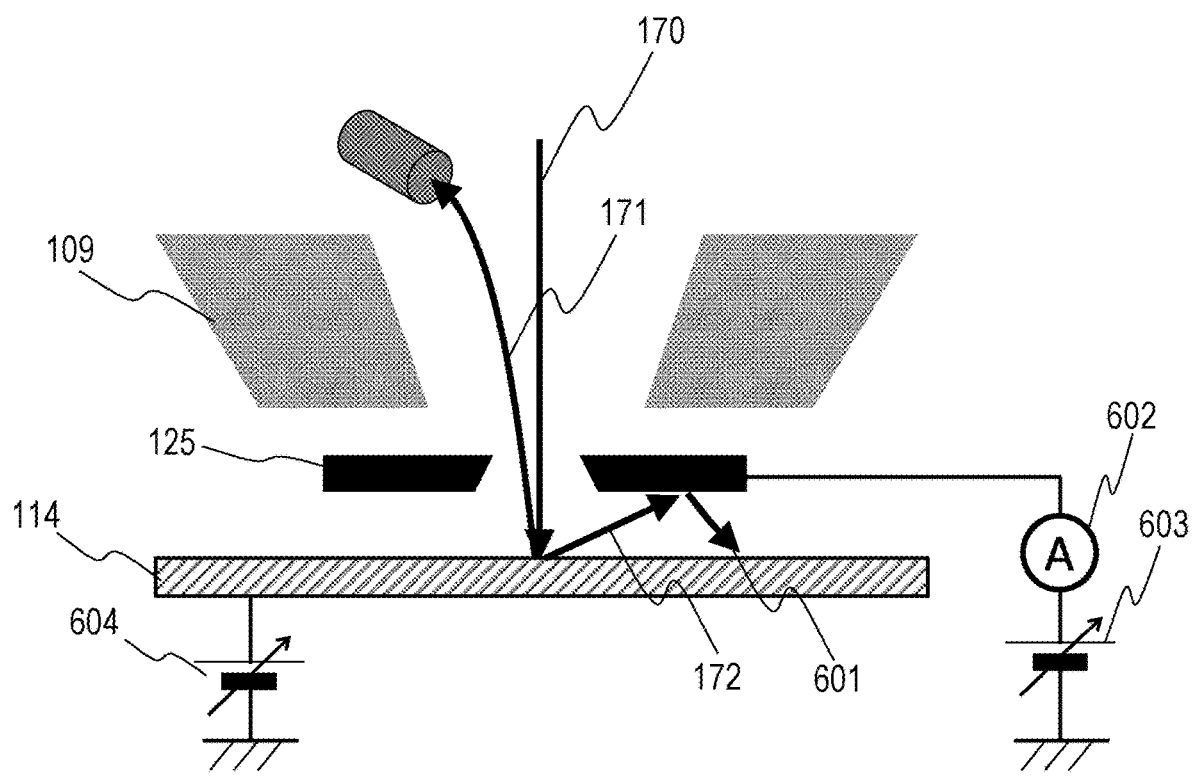
FIG. 6 is a diagram for describing a method for neutralizing an electrical charge carried by the backscattered electron detector.

A specific example of the method for neutralizing an electrical charge will be described with reference to FIG. 6. Once the backscattered electrons 172 impinge on the backscattered electron detector 125, tertiary electrons 601 are emitted from the backscattered electron detector 125. The amount of tertiary electron emission per backscattered electron depends on an accelerating voltage of the backscattered electrons 172 and a surface material of a scintillator of the backscattered electron detector 125. Further, the accelerating voltage of the backscattered electrons 172 depends on an accelerating voltage of the primary electrons 170. Therefore, an adjustment is made to the accelerating voltage of the primary electrons 170 such that the tertiary electrons emitted, in response to the backscattered electrons 172, from the backscattered electron detector 125 becomes larger in number than the backscattered electrons impinging on the backscattered electron detector 125. This adjustment makes it possible to force the backscattered electron detector 125 to take on a positive electrical charge, that is, to reduce a negative electrical charge. At this time, setting a voltage 603 applied, by the backscattered electron detection system controller 138, to the backscattered electron detector 125 to a negative voltage and/or setting a voltage 604 applied, by the sample table voltage controller 144, to the sample 114 to a positive voltage makes it possible to prevent the tertiary electrons 601 emitted from the backscattered electron detector 125 from impinging back on the backscattered electron detector 125, thereby further forcing the backscattered electron detector 125 to take on a positive electrical charge. Further, measuring the current flowing out from the backscattered electron detector 125 to the ground (ground potential) using an ammeter 602 of the backscattered electron detection system controller 138 make it possible to determine the direction of the electrical charge carried by the backscattered electron detector 125 that is either positive or negative, thereby allowing a determination as to whether the set optical condition is appropriate to be made.

Note that the method for neutralizing the negative electrical charge is applicable to a case where a positive electrical charge carried by the backscattered electron detector 125 is neutralized. To this case, a condition inverted from the condition applied to the case where the negative electrical charge is neutralized, that is, an accelerating voltage condition under which the tertiary electrons emitted in response to the backscattered electrons become smaller in number than the backscattered electrons impinging on the backscattered electron detector 125 is applied. Similarly, at this time, setting the voltage 603 applied to the backscattered electron detector 125 to a positive voltage and/or setting the voltage 604 applied to the sample 114 to be a negative voltage makes it is possible to accelerate the neutralization of the negative electrical charge.

After step S503, the voltage of the electrical charge carried by the backscattered electron detector 125 is measured again in step S501, and this operation is repeated until the voltage falls within the allowable range.

A time during which the primary electrons are emitted in step S503, that is, an electrical charge neutralization operation time, may be predetermined, or alternatively, may be determined from pre-measured changes in voltage per unit time when the primary electrons are emitted and the voltage of the electrical charge measured in S501. Alternatively, when the loop of steps S501 to 503 is repeated a plurality of times, the next electrical charge neutralization operation time may be determined, by the Newton's method, from the time, the amount of change in the voltage of the electrical charge, and the voltage of a remaining electrical charge in the last electrical charge neutralization operation.

The above-described method makes it possible to prevent influence from being exerted on the detection of the secondary electrons by neutralizing or reducing an electrical charge generated in the backscattered electron detector 125, thereby allowing highly reliable pattern measurement.

Fourth Embodiment

FIG. 7A is a flowchart of inspecting, in a simple manner, whether the backscattered electron detector 125 takes on an electrical charge. This flowchart is also executed by the device-control computer 150.

In step S701, the voltage applied to the backscattered electron detector 125 is set to a preset reference voltage Vr. The reference voltage Vr is preferably equal to 0 V. Assuming that the backscattered electron detector 125 takes on no electrical charge (assuming that the deceleration optical system is not applied to the electron-optical system), it is possible to detect whether the backscattered electron detector 125 takes on an electrical charge with high sensitivity because the detection amount of the secondary electrons changes sharply around 0 V. However, when a voltage is applied to the sample 114, or when it is difficult to stably maintain the voltage applied to the backscattered electron detector 125 to 0 V, a voltage other than 0 V may be applied.

In step S702, the image of the sample is acquired, and the average grayscale value of the image is calculated. Also in this case, the sample that takes on no electrical charge or takes on a sufficiently small electrical charge is used so as to prevent the electrical charge carried by the sample from affecting the image to be acquired.

In step S703, a determination is made as to whether the average grayscale value of the image is equal to or greater than a predetermined threshold $T_{th}$. When the average grayscale value is less than the threshold $T_{th}$, a determination is made that the backscattered electron detector 125 possibly takes on an electrical charge, and the processing proceeds to step S704 in which the electrical charge is measured.

In step S704, the voltage of the electrical charge carried by the backscattered electron detector 125 is calculated in the same manner as in steps S201 to S205 according to the first embodiment.

In step S705, the electrical charge carried by the backscattered electron detector 125 is corrected in the same manner as in step S402 according to the second embodiment. Alternatively, the electrical charge neutralization operation may be executed in the same manner as in step S503 according to the third embodiment. In such a case, as in the flowchart shown in FIG. 5, the processing may return to step S704 again to calculate the electrical charge carried by the backscattered electron detector 125, and the electrical charge neutralization operation may be repeated until the electrical charge falls within the allowable range.

Figure 7B:
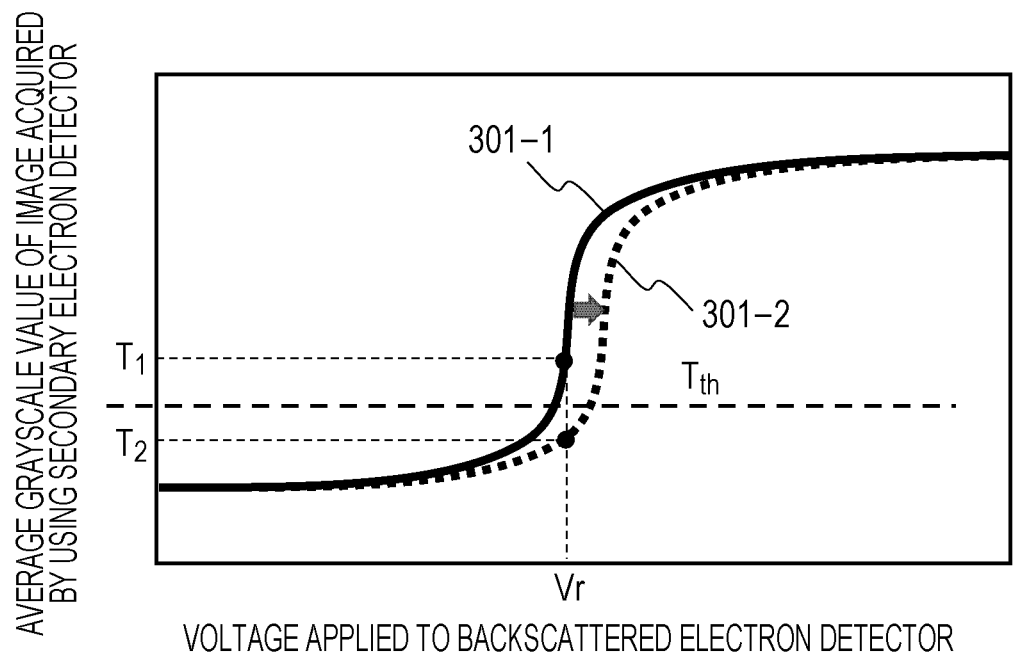
FIG. 7B is a diagram for describing a difference between average grayscale values depending on whether the backscattered electron detector takes on an electrical charge.

FIG. 7B schematically shows a difference between an average grayscale value when the backscattered electron detector 125 takes on no electrical charge (measurement 1) and an average grayscale value when the backscattered electron detector 125 takes on an electrical charge (measurement 2). It is assumed that, in measurement 1, an average grayscale value $T_1$ is obtained by the image acquisition (step S702), and in measurement 2, an average grayscale value $T_2$ is obtained by the image acquisition (step S702). As shown in FIG. 3, the voltage applied to the backscattered electron detector 125 and the average grayscale value of the acquired image have the predetermined relationship 301, and a waveform 301-2 corresponds to a waveform resulting from translating a waveform 301-1 in accordance with the amount of electrical charge carried by the backscattered electron detector 125. As described above, the average grayscale value T thus calculated decreases in a manner that depends on the amount of electrical charge carried by the backscattered electron detector 125. Therefore, appropriately setting the threshold $T_{th}$ allows a determination as to where the backscattered electron detector 125 takes on an electrical charge to be made only with one image acquisition.

The threshold $T_{th}$ can be defined based on the relationship, shown in FIG. 7B, between the voltage applied to the backscattered electron detector and the average grayscale value of the image formed by the secondary electrons, the relationship being acquired in advance through the execution of steps S201 to S204 according to the first embodiment. This makes it possible to set a threshold that allows a decrease in the detection signal of the secondary electrons due to a slight amount of electrical charge carried by the backscattered electron detector to be detected. Alternatively, when the flowchart shown in FIG. 7A is repeatedly executed on a similar sample, the threshold $T_{th}$ may be an average grayscale value that results from multiplying, by a coefficient equal to or less than one, an average value of average grayscale values obtained and stored in step S702. This makes it possible to detect that the backscattered electron detector unexpectedly takes on an electrical charge.

The above-described method makes it possible to inspect, only with one image acquisition, whether the backscattered electron detector 125 takes on an electrical charge in a simple manner, which in turn makes it possible to prevent, while minimizing a decrease in throughput, influence of the electrical charge carried by the backscattered electron detector from being exerted on the detection of the secondary electrons, thereby allowing highly reliable pattern measurement.

Fifth Embodiment

FIG. 8 is a flowchart of measuring a pattern formed on the sample 114, including inspecting whether the backscattered electron detector 125 takes on an electrical charge in a simple manner, or measuring, correcting, or neutralizing the electrical charge. This flowchart is also executed by the device-control computer 150. This flowchart shows that the methods according to the first to fourth embodiments are executed in a pattern measurement sequence at timing when the methods are applicable. Note that all the steps shown in FIG. 8 such as inspecting whether the backscattered electron detector 125 takes on an electrical charge and correcting the electrical charge need not necessarily be executed, and only necessary steps may be selected and executed with comprehensive consideration given to a risk of electrically charging the backscattered electron detector, throughput, and the like in consideration of stability of required pattern measurement, a sample, and an optical condition. Further, although this flowchart does not clearly show a correction sequence of a rotational displacement and positional displacement of the sample, it is assumed that steps necessary for the pattern measurement are included. Note that this flowchart is applicable to not only the pattern measurement but also pattern inspection.

In step S801, the field of view is moved to a calibration sample 115 for optical axis adjustment by moving the stage 112 or an application position of the primary electrons 170. The calibration sample 115 is placed on the sample table 113, and a calibration pattern for optical axis adjustment is formed on a surface of the calibration sample 115.

In step S802, an optical axis adjustment sequence is executed using an image of the calibration pattern. The voltage applied to the backscattered electron detector 125 when the adjustment to the optical condition of the electron-optical system including the optical axis adjustment is completed is defined as the reference voltage Vr (see the fourth embodiment).

In step S803, the field of view is moved to a standard sample for measurement of the electrical charge carried by the backscattered electron detector 125. Herein, the standard sample is a sample that takes on no electrical charge or takes on a sufficiently small electrical charge. When the calibration sample 115 doubles as the standard sample, step S803 may be omitted.

In step S804, the voltage of the electrical charge carried by the backscattered electron detector 125 is calculated in the same manner as in steps S201 to 205 according to the first embodiment. Note that, after calculating the voltage of the electrical charge in step S804, step S402 according to the second embodiment is preferably executed to correct the electrical charge. In this case, the reference voltage Vr is corrected to a voltage that results from adding the offset voltage applied to the backscattered electron detector 125 to the reference voltage Vr, and the offset-corrected reference voltage is used as the reference voltage Vr in the subsequent steps. Alternatively, steps S502, S503, S501 according to the third embodiment may be repeatedly executed until the voltage of the electrical charge falls within the allowable range, so as to neutralize the electrical charge.

In step S805, the field of view is moved to an alignment pattern of the sample 114 to be measured. The alignment pattern is a pattern that is provided in order to keep a measurement target pattern in the field of view and has a known distance to the measurement target pattern.

In step S806, an image of the alignment pattern is acquired, and an accurate distance from the position of the alignment pattern in the field of view to the measurement target pattern is calculated. At this time, the voltage applied to the backscattered electron detector 125 is set to the reference voltage Vr.

In step S807, a simple inspection of whether the backscattered electron detector 125 takes on the electrical charge is performed using the image of the alignment pattern acquired in step S806 in the same manner as in steps S702 to 703 according to the fourth embodiment. When a determination is made that the backscattered electron detector 125 takes on the electrical charge, the processing proceeds to step S808 in which the electrical charge carried by the backscattered electron detector 125 is corrected in the same manner as in steps S704 to 705 according to the fourth embodiment, and the reference voltage Vr is also corrected to a voltage that results from adding the offset voltage applied to the detector 125 to the reference voltage Vr. The offset-corrected reference voltage is used as the reference voltage Vr in the subsequent steps. Subsequently, the processing returns to step S806, the image of the alignment pattern is acquired again, and the accurate distance from the position of the alignment pattern to the measurement target pattern is calculated again.

When a determination is made in step S807 that the backscattered electron detector 125 takes on no electrical charge, the processing proceeds to step S809 in which the field of view is moved from the alignment pattern to the measurement target pattern. As the movement amount at this time, the accurate distance calculated in step S806 is used. This allows the measurement target pattern to be moved to a desired position within the field of view with high reproducibility.

In step S810, while changing the voltage applied to the backscattered electron detector 125 to change the focus position, an image acquired by using the secondary electron detector 120 is acquired, and the focus is adjusted to maximize image sharpness (autofocus). Making the focus adjustment by changing the voltage applied to the backscattered electron detector 125 allows the image acquired while changing the voltage applied to the backscattered electron detector 125 for the focus adjustment to be used in the next step S811 for calculation of the voltage of the electrical charge carried by the backscattered electron detector 125. When the focus adjustment using the image acquired by using the secondary electron detector 120 is difficult due to a degradation in image grayscale value or the like, the focus adjustment may be made using an image acquired, at the same time, by using the backscattered electron detector 125 or an image acquired by using another detector. When the focus adjustment is difficult even with such an image, it is necessary to make the focus adjustment by changing a current flowing through the objective lens or a voltage applied to other electrodes. In this case, step S811 is skipped (the voltage of the electrical charge carried by the backscattered electron detector 125 is not measured).

In step S811, the voltage of the electrical charge carried by the backscattered electron detector 125 is calculated, in the same manner as in step S205 according to the first embodiment, using the image acquired by using the secondary electron detector 120 for the focus adjustment in step 810, that is, the image acquired by using the secondary electron detector 120 while changing the voltage applied to the backscattered electron detector 125. Note that, after measuring the electrical charge, step S402 according to the second embodiment is preferably executed to correct the electrical charge. In this case, the reference voltage Vr is corrected to a voltage that results from adding the offset voltage applied to the backscattered electron detector 125 to the reference voltage Vr, and the offset-corrected reference voltage is used as the reference voltage Vr in the subsequent steps.

In step S812, the image is acquired by using the secondary electron detector 120. The voltage applied to the backscattered electron detector 125 at this time is the reference voltage Vr. When a voltage different from the optimum applied voltage determined by the autofocus in step S810 is applied to the backscattered electron detector 125, focus displacement may occur. When the voltage, set to the reference voltage Vr, applied to the backscattered electron detector 125 causes a degradation in image grayscale even when the focus adjustment is made in a different manner, the voltage may affect the pattern measurement result in the next step S813; therefore, the voltage applied to the backscattered electron detector 125 needs to be set to a voltage that prevents a degradation in image grayscale or focus displacement from occurring. In this case, step S814 is skipped (the simple inspection of whether the backscattered electron detector 125 takes on the electrical charge is not performed). Note that an image may be acquired by using the backscattered electron detector 125 at the same time in step S812.

In step S813, the pattern is measured based on the image acquired by using the secondary electron detector 120 or the image acquired by using the backscattered electron detector 125 in step S812.

In step S814, the simple inspection of whether the backscattered electron detector 125 takes on the electrical charge is performed in the same manner as in steps S702 to 703 according to the fourth embodiment using the image acquired by using the secondary electron detector 120 in step S812. When a determination is made that the backscattered electron detector 125 takes on the electrical charge, it is desirable that an error be displayed as in the first embodiment, or the electrical charge carried by the backscattered electron detector 125 be corrected in the same manner as in steps S704 to 705 according to the fourth embodiment. When the electrical charge carried by the backscattered electron detector 125 is corrected, the reference voltage Vr is also corrected to a voltage that results from adding the offset voltage applied to the backscattered electron detector 125 to the reference voltage Vr, and the offset-corrected reference voltage is used as the reference voltage Vr in the subsequent steps.

In step S815, a determination is made as to whether the measurement of all the measurement target patterns is completed, and steps S805 to S814 are repeated until the measurement is completed.

In the flowchart shown in FIG. 8, selecting and executing necessary and sufficient steps related to the inspection and neutralization of the electrical charge carried by the backscattered electron detector 125 makes it possible to detect, correct, or neutralize the electrical charge generated in the backscattered electron detector 125 while minimizing or preventing a decrease in throughput, thereby allowing highly reliable pattern measurement.

Sixth Embodiment

Figure 10:
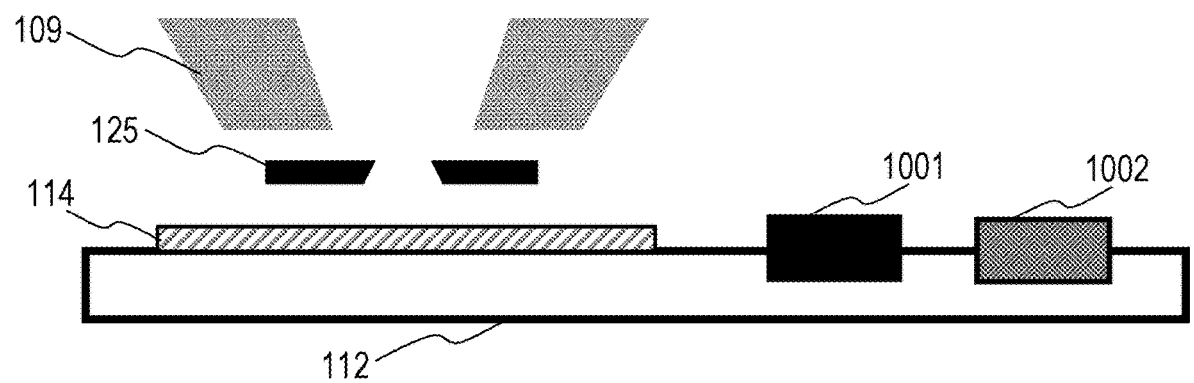
FIG. 10 is a schematic view of a stage including a surface potential measuring probe and an electrical charge neutralizer.

FIG. 9 is a flowchart of measuring the electrical charge carried by the backscattered electron detector using a surface potential measuring probe. FIG. 10 shows a schematic view of the stage 112 according to the present embodiment (the sample table 113 is not shown here). A surface potential measuring probe 1001 and an electrical charge neutralizer 1002 are arranged on the stage 112.

In step S901, the stage 112 is moved so as to cause the surface potential measuring probe 1001 to face the backscattered electron detector 125.

In step S902, a surface potential of the backscattered electron detector 125, that is, the voltage of the electrical charge is measured using the surface potential measuring probe 1001.

In step S903, a determination is made as to whether the voltage of the electrical charge measured in step S902 falls within the allowable range, and when the voltage falls out of the allowable range, the processing proceeds to step S904.

In step S904, the stage 112 is moved so as to cause the electrical charge neutralizer 1002 to face the backscattered electron detector 125. Herein, the electrical charge neutralizer 1002 is a device such as an ultraviolet irradiator, a plasma generator, or an electron or ion generator that reduces an electrical charge carried on a surface of the target.

In step S905, the electrical charge neutralizer 1002 is used to neutralize the electrical charge carried by the backscattered electron detector 125.

Note that, in the present embodiment, only the electrical charge measurement (steps S901 to 902) may be made, or only the electrical charge reduction may be periodically made (steps S904 to 905) without the electrical charge measurement.

The above-described method can be executed in a time period over which the primary electrons cannot be emitted, such as a waiting time for vacuum evacuation when the sample 114 held on the stage 112 is replaced or a waiting time for the optical condition change. This makes it possible to measure the electrical charge generated in the backscattered electron detector 125 without a decrease in overall pattern measurement throughput. This in turn makes it possible to exclude a result of pattern measurement affected by the electrical charge from the whole result or to encourage maintenance to prevent the electrical charge from further exerting influence or further increasing. Similarly, it is possible to neutralize the electrical charge generated in the backscattered electron detector 125 without a decrease in overall throughput. As a result, highly reliable pattern measurement becomes possible.

Further, the sixth embodiment may be combined with the first to fifth embodiments. For example, the determination as to whether the voltage of the electrical charge falls within the allowable range according to the first to fifth embodiments may be made in the same manner as in the sixth embodiment (steps S901 to S903). Alternatively, the neutralization of the electrical charge according to the third to fifth embodiments may be made in the same manner as in the sixth embodiment (steps S904 to 905).

Figure 11:
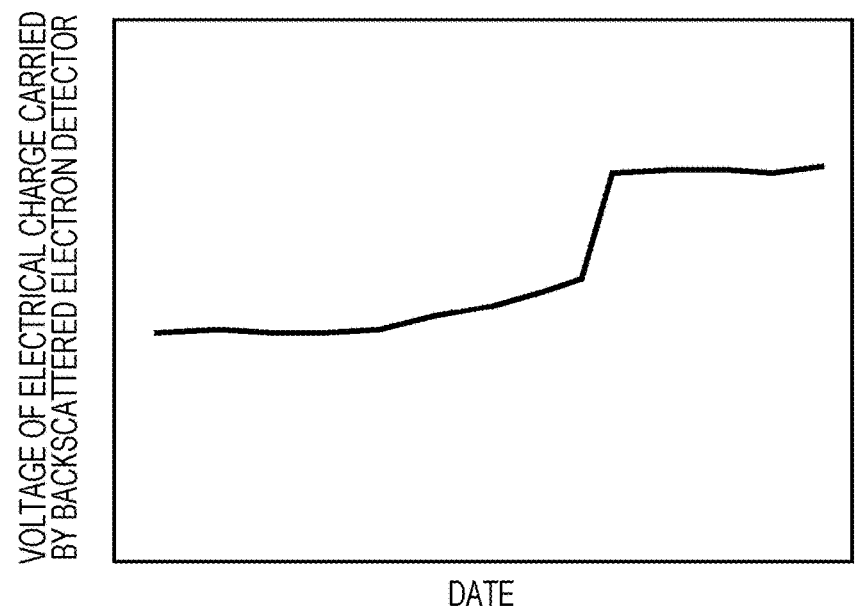
FIG. 11 is a display example of changes over time in voltage of an electrical charge carried by the backscattered electron detector.

Periodically measuring the voltage of the electrical charge carried by the backscattered electron detector 125 described in the above embodiments allows changes in electrical charge to be monitored. FIG. 11 shows an example of display of a monitor result. Such a display allows the progress of the electrical charge carried by the backscattered electron detector to be grasped and allows measures such as replacement or cleaning of the backscattered electron detector to be taken before influence is exerted on the detection of the secondary electrons.

Further, the display can also be used for estimation of a cause of generating the electrical charge in the backscattered electron detector. For example, when the voltage of the electrical charge significantly increases before and after the measurement of a specific sample, it is suggested that degassing from the sample may have caused organic contaminants to adhere to the backscattered electron detector and accelerate the electrical charge.

This in turn makes it possible to prevent the backscattered electron detector from taking on an electrical charge by avoiding the measurement of such a sample or reviewing the processing before the measurement.

What is claimed is:

1. A scanning electron microscope comprising:
   an electron-optical system including an electron source configured to emit primary electrons and an objective lens;
   a stage on which a sample is placed;
   a secondary electron detector disposed adjacent to the electron source relative to the objective lens and configured to detect secondary electrons emitted by interactions between the primary electrons and the sample;
   a backscattered electron detector disposed between the objective lens and the stage and configured to detect backscattered electrons emitted by interactions between the primary electrons and the sample;
   a backscattered electron detection system controller provided for the backscattered electron detector and configured to apply a voltage to the backscattered electron detector; and
   a device-control computer configured to detect a state of an electrical charge carried by the backscattered electron detector based on signal intensity at the secondary electron detector when the primary electrons are applied to the sample with a predetermined voltage applied to the backscattered electron detector.

2. The scanning electron microscope according to claim 1, wherein the device-control computer acquires the signal intensity at the secondary electron detector when applying the primary electrons to the sample while changing the predetermined voltage applied to the backscattered electron detector, and calculates a voltage of the electrical charge carried by the backscattered electron detector based on a relationship between the signal intensity at the secondary electron detector acquired and the voltage applied to the backscattered electron detector.

3. The scanning electron microscope according to claim 2, wherein the device-control computer determines, based on the relationship between the signal intensity at the secondary electron detector acquired and the voltage applied to the backscattered electron detector, a voltage applied to the backscattered electron detector when the signal intensity at the secondary electron detector sharply changes, and calculates a voltage that results from positive/negative inversion of the voltage applied to the backscattered electron detector as the voltage of the electrical charge carried by the backscattered electron detector.

4. The scanning electron microscope according to claim 2, further comprising a display device, wherein the device-control computer causes the display device to display an error when the voltage of the electrical charge carried by the backscattered electron detector calculated falls out of an allowable range.

5. The scanning electron microscope according to claim 2, wherein the device-control computer applies, to the backscattered electron detector, an offset voltage corresponding to the voltage of the electrical charge carried by the backscattered electron detector calculated.

6. The scanning electron microscope according to claim 2, further comprising:

a sample table configured to hold the sample placed on the stage; and a sample table voltage controller configured to apply a voltage to the sample table, wherein the device-control computer applies, to the sample table, an offset voltage corresponding to the voltage of the electrical charge carried by the backscattered electron detector calculated.

7. The scanning electron microscope according to claim 2, wherein the device-control computer applies the primary electrons to the sample with the electron-optical system configured to satisfy a predetermined optical condition, and the predetermined optical condition includes an accelerating voltage condition under which tertiary electrons are emitted in response to the backscattered electrons impinging on the backscattered electron detector, the backscattered electrons being emitted by interactions between the primary electrons applied to the sample under the predetermined optical condition and the sample, and the tertiary electrons emitted is larger in number than the backscattered electrons impinging on the backscattered electron detector.

8. The scanning electron microscope according to claim 7, wherein the device-control computer applies a negative voltage to the backscattered electron detector during a time period over which the primary electrons are applied to the sample with the electron-optical system configured to satisfy the predetermined optical condition.

9. The scanning electron microscope according to claim 7, wherein the backscattered electron detection system controller measures a current flowing between the backscattered electron detector and a ground during a time period over which the primary electrons are applied to the sample with the electron-optical system configured to satisfy the predetermined optical condition.

10. The scanning electron microscope according to claim 1, wherein the device-control computer acquires the signal intensity at the secondary electron detector when applying the primary electrons to the sample with a predetermined reference voltage applied to the backscattered electron detector, and compares the signal intensity at the secondary electron detector acquired to a threshold voltage to determine whether the backscattered electron detector takes on an electrical charge.

11. The scanning electron microscope according to claim 1, wherein the device-control computer applies the primary electrons to the sample with the predetermined voltage applied to the backscattered electron detector, acquires an image based on the secondary electrons detected by the secondary electron detector, and takes an average grayscale value of the image as the signal intensity at the secondary electron detector.

12. The scanning electron microscope according to claim 1, wherein the backscattered electron detector includes an annular scintillator.

* * * * *